United States Patent
Kitajima

(10) Patent No.: US 8,314,349 B2
(45) Date of Patent: Nov. 20, 2012

(54) LEAD PIN AND WIRING SUBSTRATE WITH LEAD PIN, AND METHOD OF MANUFACTURING THE SAME

(75) Inventor: Masakuni Kitajima, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/911,232

(22) Filed: Oct. 25, 2010

(65) Prior Publication Data

US 2011/0103029 A1 May 5, 2011

(30) Foreign Application Priority Data

Nov. 5, 2009 (JP) ................................. 2009-254182

(51) Int. Cl.
*H05K 1/11* (2006.01)

(52) U.S. Cl. ....................................................... 174/265

(58) Field of Classification Search .................. 174/265, 174/267; 257/697, 773, 784; 361/689, 774; 439/876

See application file for complete search history.

(56) References Cited

U.S. PATENT DOCUMENTS

| 6,359,332 | B2 | 3/2002 | Shiraishi | |
| 7,485,017 | B2* | 2/2009 | Pang et al. | 439/876 |
| 2009/0056992 | A1* | 3/2009 | Takeuchi et al. | 174/257 |

FOREIGN PATENT DOCUMENTS

JP 2001-217341 A1 8/2001

* cited by examiner

*Primary Examiner* — Jeremy Norris
*Assistant Examiner* — Tremesha S Willis
(74) *Attorney, Agent, or Firm* — Kratz, Quintos & Hanson, LLP

(57) ABSTRACT

A lead pin includes a shaft portion, a connection head portion provided to a top end side of the shaft portion, and having a diameter which is larger than a diameter of the shaft portion, wherein the connection head portion includes a bonding surface on an opposite side to the shaft portion side, and the bonding surface includes a flat surface provided in a center part, a convex surface which is provided like a ring shape to an outside of the flat surface and rounded by a radius R like a convex shape, and a concave surface which is provided like a ring shape to an outside of the convex surface and rounded by a radius R like a concave shape.

12 Claims, 12 Drawing Sheets the amount of return is small

← the amount of return is large

← correction of inclination (lead pin of the embodiment)    (round type lead pin)

analysis model

LEAD PIN AND WIRING SUBSTRATE WITH LEAD PIN, AND METHOD OF MANUFACTURING THE SAME

CROSS-REFERENCE TO RELATED APPLICATIONS

This application is based upon and claims the benefit of priority of the prior Japanese Patent Application No. 2009-254182, filed on Nov. 5, 2009, the entire contents of which are incorporated herein by reference.

FIELD

It is related to a lead pin and a wiring substrate with lead pin and a method of manufacturing the same.

BACKGROUND

In the prior art, as the wiring substrate on which an electronic component is mounted, there is the PGA (Pin Grid Array) type wiring substrate. In the PGA type wiring substrate, a plurality of electrode pads to which the electronic component is connected are provided on one surface, and also a plurality of lead pins which are inserted into sockets of the motherboard are aligned in grid-like type on the other surface and are provided to stand.

In Patent Literature 1 (Japanese Laid-open Patent Publication No 2001-217341), it is set forth that a bonding surface of the flange to which the lead pin is soldered is formed like a convex spherical shape, and a wetting extent-edge of the solder is extended beyond an outermost edge up to the position that does not reach the shaft portion in the surface opposite to the bonding surface, whereby constriction of the solder and a reduction of a bonding strength are prevented.

As explained in the column of the related art described later, when the semiconductor chip is reflow soldered to the upper side of the wiring substrate, to the lower side of which the lead pins are fixed by the solder layer, simultaneously the solder layer fixing the lead pins is reflown again by the heating process. At this time, an inclination of the lead pin which is arranged in an inclined state is corrected in the perpendicular direction by the reflow of solder and the gravitation.

In the round type lead pin, since an adequate amount of solder is arranged in the periphery of the side surface of the connection head portion, an enough amount of return can be obtained, and an inclination of the lead pin can be corrected.

However, in the flat type lead pin, since an amount of solder which is arranged in the periphery of the side surface of the connection head portion is small, an enough amount of return cannot be obtained, and in many cases the inclination failure is caused.

SUMMARY

According to one aspect discussed herein, there is provided a lead pin, which includes a shaft portion; and a connection head portion provided to a top end side of the shaft portion, and having a diameter which is larger than a diameter of the shaft portion, wherein the connection head portion includes a bonding surface on an opposite side to the shaft portion side, and the bonding surface includes a flat surface provided in a center part, a convex surface which is provided like a ring shape to an outside of the flat surface and rounded by a radius R like a convex shape, and an inclining surface which is provided like a ring shape to an outside of the convex surface and whose height is lowered toward an outside gradually.

DESCRIPTION OF EMBODIMENTS

An embodiment of the present invention will be explained with reference to the accompanying drawings hereinafter.

(Related Art)

Figure 1:
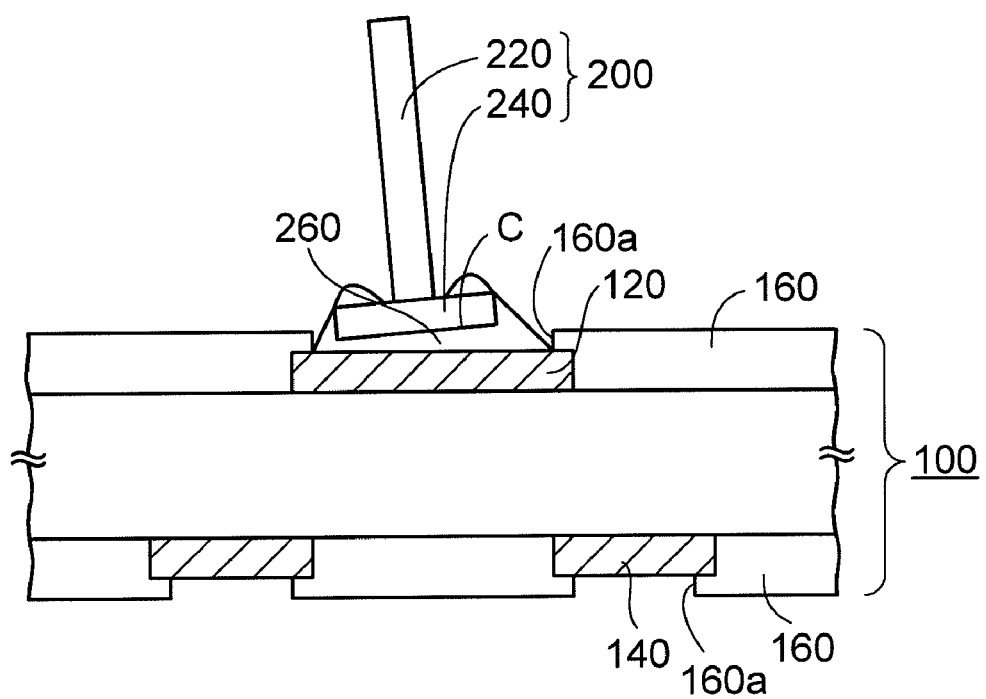
FIG. 1 is a sectional view (#1) depicting a state of fitting a flat type lead pin onto a wiring substrate in the related art.
Figure 2:
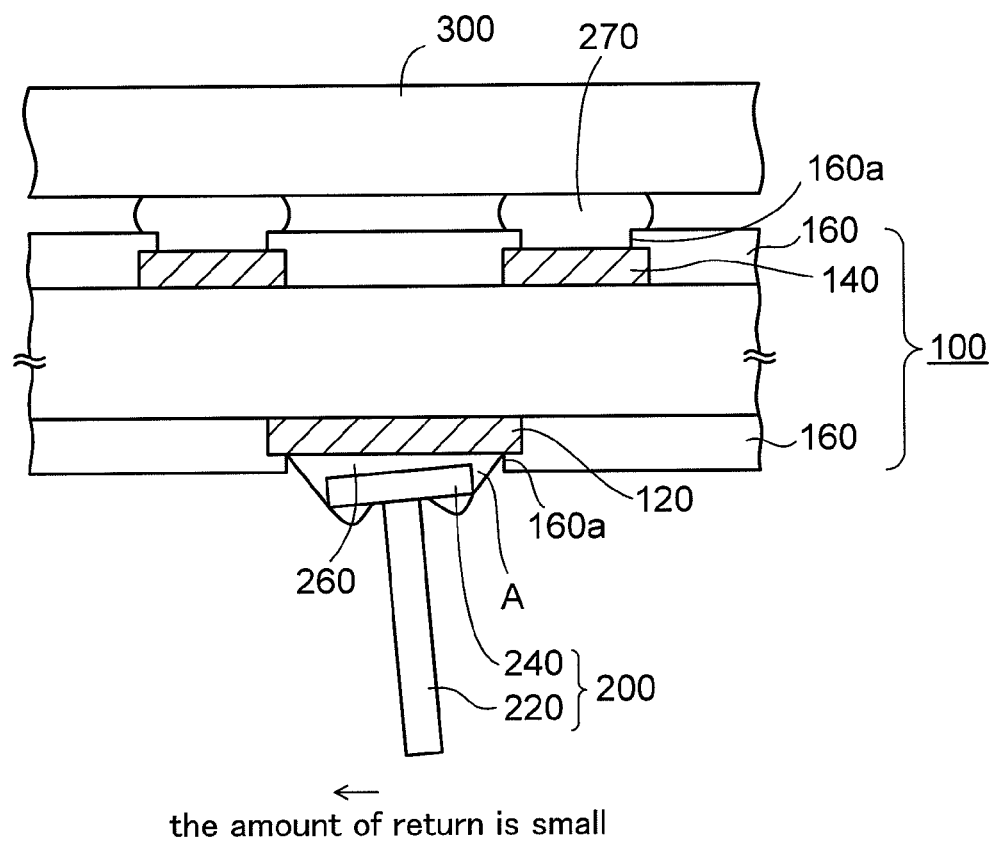
FIG. 2 is a sectional view (#2) depicting the state of fitting the flat type lead pin onto the wiring substrate in the related art.
Figure 3:
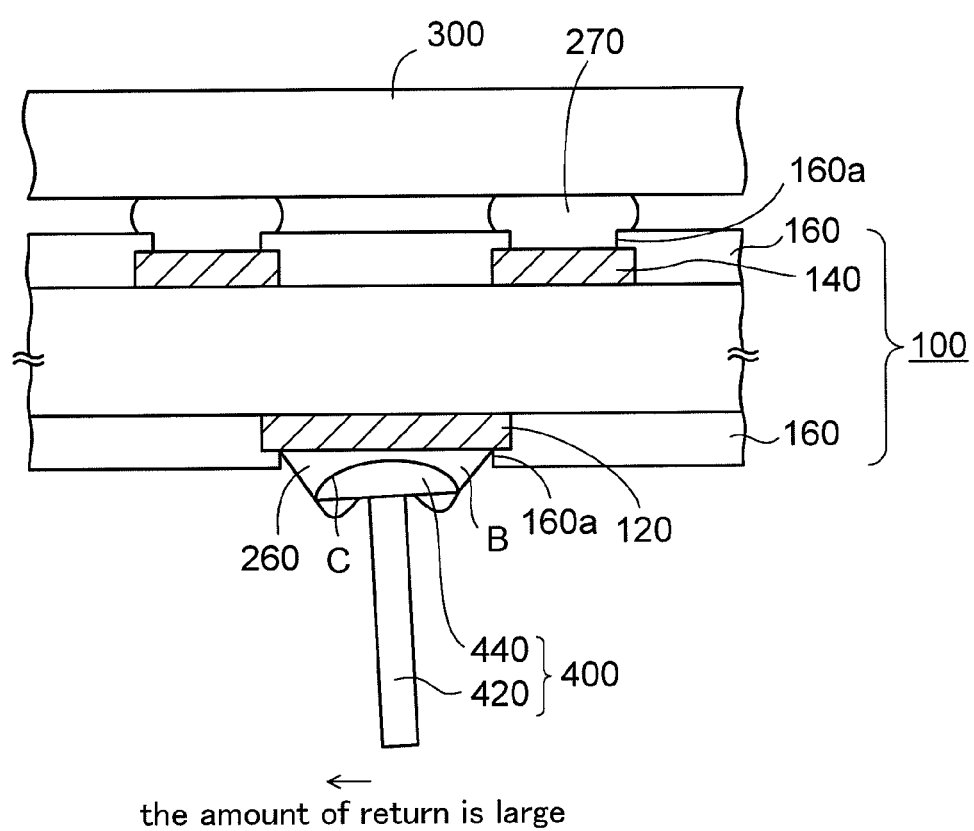
FIG. 3 is a sectional view depicting the state of fitting the round type lead pin onto the wiring substrate in the related art.

Prior to the explanation of an embodiment, the related art (preliminary matter) will be explained hereunder. FIG. 1 to FIG. 3 are sectional views depicting a state of fitting a flat type lead pin onto a wiring substrate in the related art.

In the related art, first, a wiring substrate 100 depicted in FIG. 1 is prepared. In the wiring substrate 100, a pin connection portion 120 is provided on one surface, and chip connection portions 140 are provided on the other surface. A solder resist 160 in which an opening portion 160a is formed on the pin connection portion 120 and the chip connection portions 140 respectively is formed on both surface sides of the wiring substrate 100 respectively.

Then, a lead pin 200 which is constructed by a shaft portion 220, and a connection head portion 240 whose diameter is larger that that of the shaft portion 220 is prepared. The lead pin 200 is a flat type, and the connection head portion 240 has a bonding surface C which is flat over the whole.

Then, solder is coated on the pin connection portion 120 of the wiring substrate 100, and then the connection head portion 240 of the lead pin 200 is arranged on the solder. Then, the reflow soldering is applied by executing the heating process. Thus, the lead pin 200 is joined and fixed to the pin connection portion 120 of the wiring substrate 100 via a solder layer 260.

At this time, upon soldering a large number of lead pins 200, often the lead pin 200 which is arranged in an inclined state occurred. In FIG. 1, an example in which the lead pin 200 is inclined left side as one faces is depicted.

Then, as depicted in FIG. 2, the wiring substrate 100 on which the lead pin 200 in FIG. 1 is fitted is reversed up and down, and the chip connection portion 140 is directed upward. Then, a semiconductor chip 300 is arranged on the wiring substrate 100 via the solder, and the reflow soldering is applied to them by the heating process. As a result, the connection electrodes of the semiconductor chip 300 are flip-chip connected to the chip connection portions 140 of the wiring substrate 100 via a solder layer 270.

At this time, in the heating process applied in the reflow soldering of the semiconductor chip 300, the solder layer 260 fixing the lead pin 200 is reflown again.

By this matter, an inclination of the lead pin 200 which is arranged to incline in a state of hanging in midair under the wiring substrate 100, is corrected by the reflow of the solder layer 260 and the gravitation to the direction opposite to the inclined direction (the perpendicular direction side).

At this time, in the flat type lead pin 200 having the bonding surface C which is flat over the whole, an amount of solder layer 260 which is arranged in the periphery of the side surface (an A portion in FIG. 2) of the connection head portion 240 is relatively small. Therefore, a moving amount (an amount of return) of the lead pin in the perpendicular direction is small, and sometimes the inclination of the lead pin deviates from a permissible value of an inclination in the design specification.

Then, the case where a round (convex spherical) type lead pin is employed instead of the flat type lead pins 200 in FIG. 1 and FIG. 2 will be explained hereunder. As depicted in FIG. 3, a round type lead pin 400 is constructed by a shaft portion 420, and a connection head portion 440 whose diameter is larger than that of the shaft portion 420, and the bonding surface C of the connection head portion 440 is formed like a convex spherical surface.

In FIG. 3, like FIG. 2, such a state is depicted that the round type lead pin 400 is fitted to the wiring substrate 100, and then the semiconductor chip 300 is connected to the wiring substrate 100 by applying the reflow soldering. At this time, like FIG. 2, the solder layer 260 fixing the lead pin 400 is reflown again, thus an inclination of the lead pin 400 is corrected.

At this time, in the round type lead pin 400, an amount of solder layer 260 which is arranged in the periphery of the side surface (B part in FIG. 3) of the connection head portion 440 is relatively large. As a result, in the round type lead pin 400, a moving amount in the perpendicular direction (an amount of return) becomes larger than the flat type lead pin 200 in FIG. 2, and thus the occurrence of the inclination failure can be prevented.

As the result of the earnest study of the related art mentioned above, the inventor of this application developed the lead pin having such a new shape that an amount of return that is equivalent to that of the round type lead pin can be ensured at a time of the reflow soldering of the solder layer fixing the lead pin (at a time of mounting the semiconductor chip), on a basis of the flat type lead pin.

(Embodiment)

Figure 4:
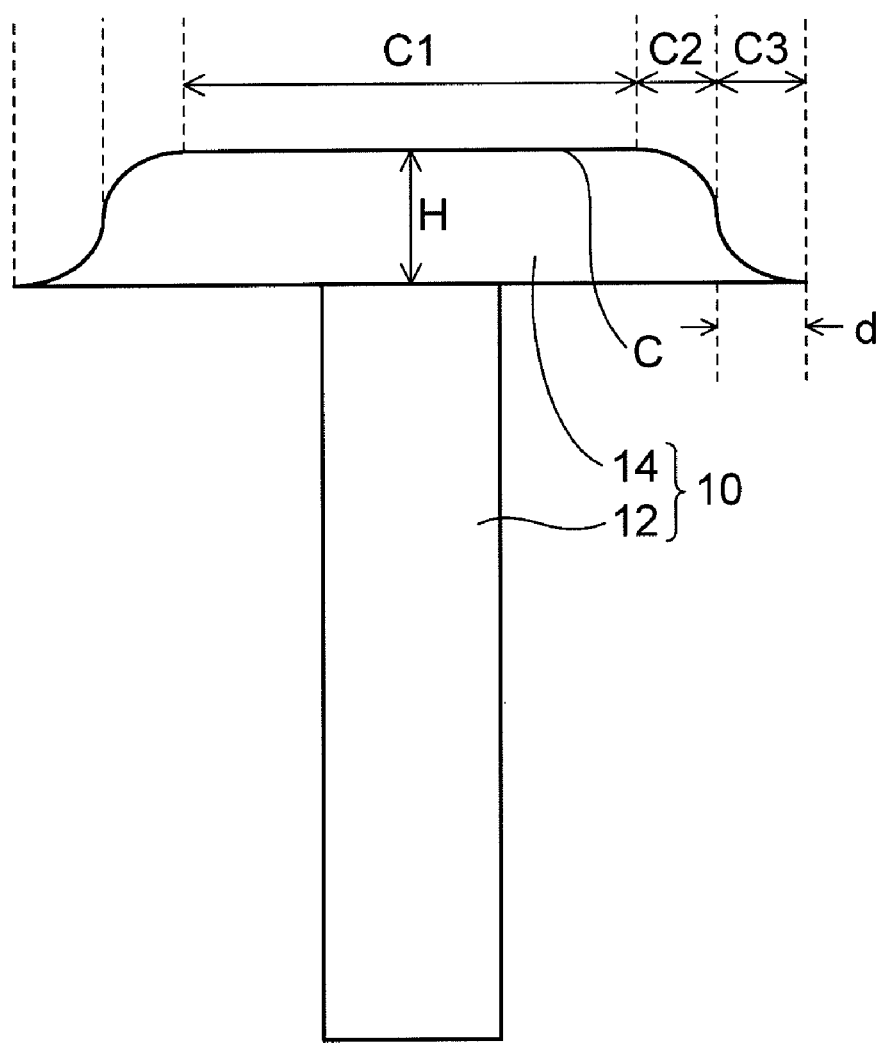
FIG. 4 is a side view depicting a lead pin according to an embodiment.
Figure 5:
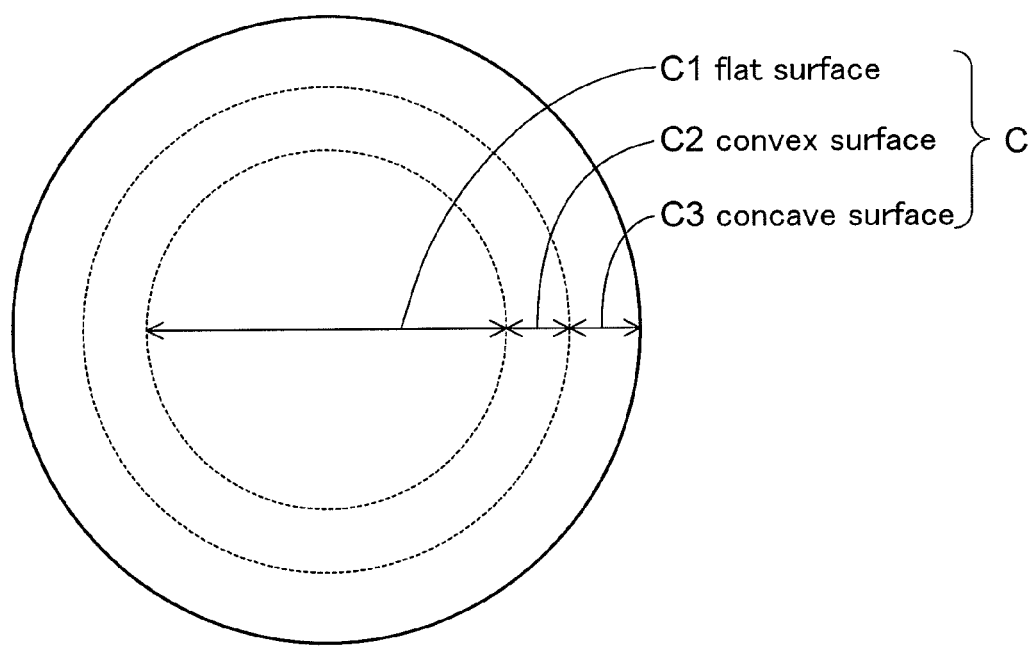
FIG. 5 is a plan view of a connection head portion of the lead pin in FIG. 4 when viewed from the top.
Figure 6:
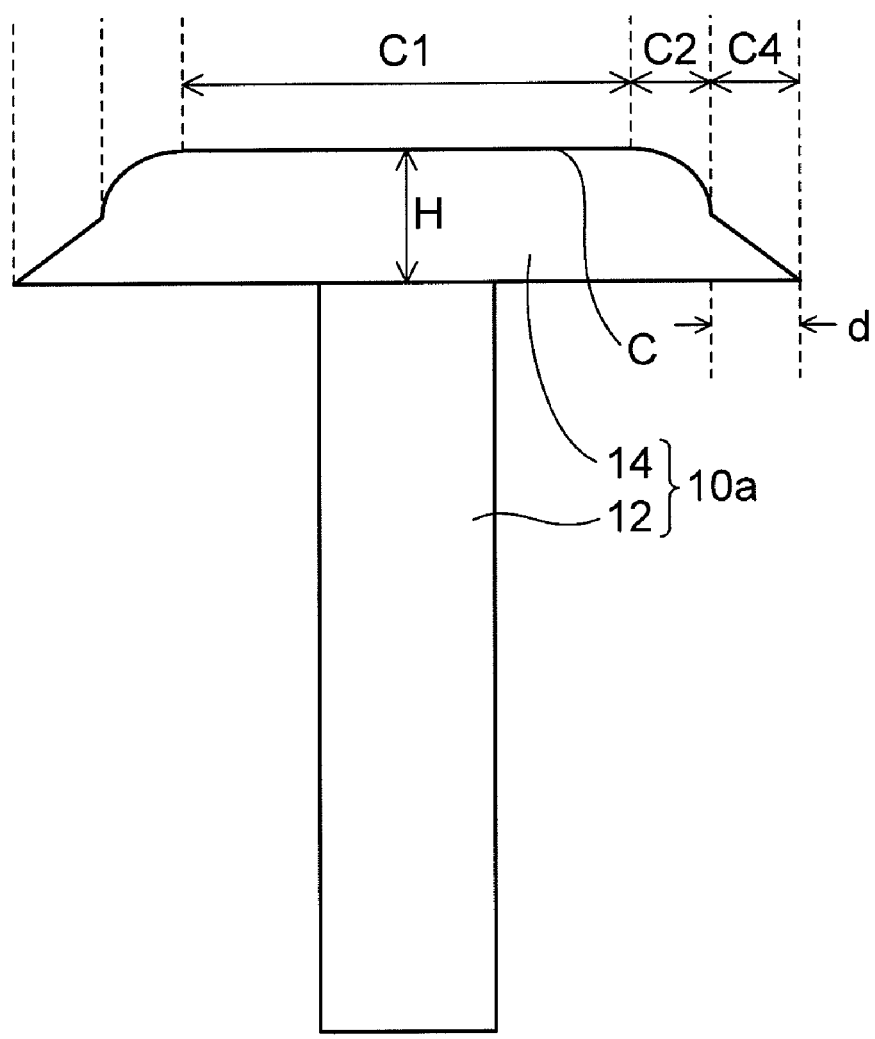
FIG. 6 is a side view depicting a lead pin according to a variation of the embodiment.
Figure 7:
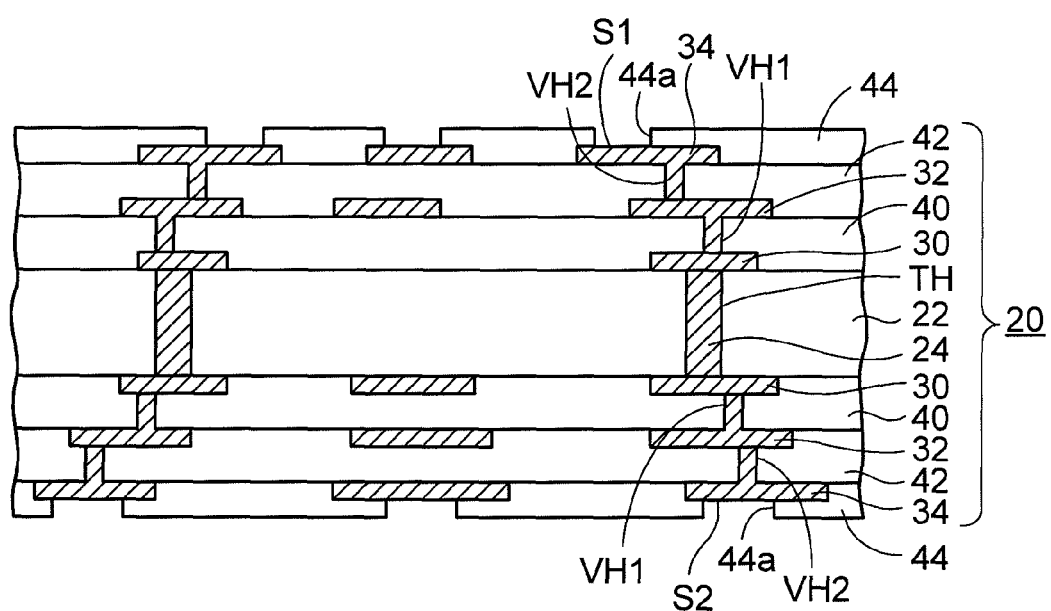
FIG. 7 is a sectional view (#1) depicting a method of manufacturing a wiring substrate with lead pin according to an embodiment.
Figure 8:
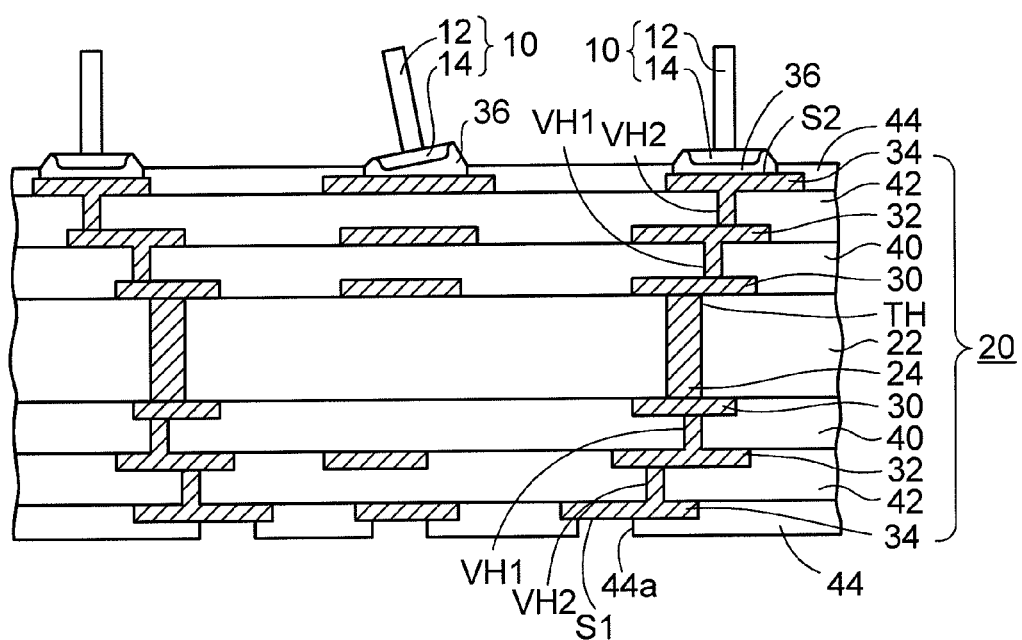
FIG. 8 is a sectional view (#2) depicting the method of manufacturing the wiring substrate with lead pin according to the embodiment.
Figure 9:
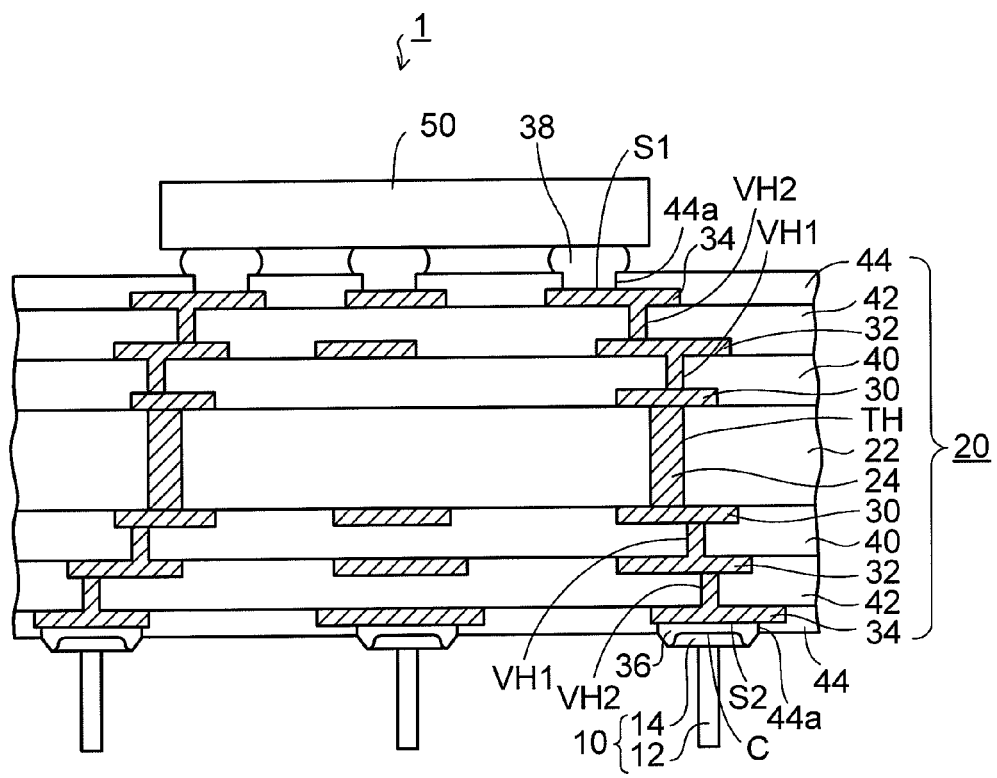
FIG. 9 is a sectional view (#3) depicting the method of manufacturing the wiring substrate with lead pin according to the embodiment.

FIG. 4 and FIG. 5 are views depicting a lead pin according to an embodiment, FIG. 6 is a view depicting a lead pin according to a variation of the embodiment, and FIG. 7 to FIG. 9 are sectional views depicting a method of manufacturing the wiring substrate with lead pin according to the embodiment.

As depicted in FIG. 4, a lead pin 10 according to the embodiment is constructed by a shaft portion 12, and a connection head portion 14 which has a diameter larger than that of the shaft portion 12 and is provided to the top end side of the shaft portion 12, and has a so-called nail shape. The connection head portion 14 has the bonding surface C which is connected to the pin connection portion of the wiring substrate.

By reference to FIG. 5 in which the bonding surface C of the lead pin 10 is viewed from the top, together with FIG. 4, the bonding surface C is constructed by a flat surface C1 that is horizontal surface provided in a center part of the bonding surface C, a convex surface C2 provided like an ring shape in the periphery of the outside of the flat surface C1 and which is rounded like a convex shape by a radius R, and a concave surface C3 provided like a ring shape in the periphery of the outside of the convex surface C2 and which is rounded like a concave shape by a radius R.

The convex surface C2 which is rounded by the radius R like a convex shape is formed such that the convex surface C2 corresponds to a part of circumference of a circle with a radius R when viewed from the side (i.e., in radial cross section, wherein the convex surface is generally toroidal; see FIG. 4). Similarly, the concave surface C3 which is rounded by a radius R2 like a concave shape is formed such that the concave surface C3 corresponds to a part of circumference of a circle with a radius R when viewed from the side. FIG. 4 shows that the flat surface Cl, provided in a center part, extends to the convex surface C2 which is substantially a ring shape at an outer periphery of the flat surface C1 such that the flat surface C1 is continuous with and smoothly joins the convex surface C2, and a peripheral edge of the flat C1 surface and an inside edge of the convex surface C2 meet at an identical height position (in the axial direction of the shaft 10) and the flat surface C1 does not protrude from the convex surface C2.

The lead pin 10 is formed of copper (Cu), Cu alloy, Nickel (Ni)-iron (Fe)-cobalt (Co) alloy (Kovar), or the like.

In this manner, in the lead pin 10 in the present embodiment, the convex surface C2 which is rounded by a radius R like a convex shape, and the concave surface C3 which is rounded by a radius R like a concave shape, are provided in the periphery side of the bonding surface C of the connection head portion 14.

As described later, when the semiconductor chip is connected to the upper side of the wiring substrate, to the lower side of which the lead pins 10 are fixed by the solder layer with the reflow soldering, simultaneously the solder layer fixing the lead pins 10 is reflown again by the heating process. At this time, by employing the lead pins 10 of the embodiment, an adequate amount of solder is arranged in the periphery of the side surface of the connection head portion 14, and such solder is reflown again. Therefore, the lead pin 10 which is arranged in an inclined state can be corrected sufficiently in the perpendicular direction side.

In FIG. 6, a lead pin 10a according to a variation of the embodiment is depicted. As depicted in FIG. 6, in the lead pin 10a according to the variation, a straight inclining surface C4 is provided in place of the foregoing concave surface C3 of the connection head portion 14 of the lead pin 10 in FIG. 4. The straight inclining surface C4 is an inclined flat surface whose height is lowered as a distance goes outward from the end of the convex surface C2.

A width d (FIG. 6) of the straight inclining surface C4 of the connection head portion 14 is set in a range of ½ H (0.5 H) to H, when a thickness of the connection head portion 14 is set to H. In FIG. 6, other elements are similar to the lead pin 10 in FIG. 4. In the lead pin 10a according to the variation, the similar advantage to those of the lead pin 10 in FIG. 4 can be achieved.

In the embodiment, the concave surface C3 is provided in the outside of the convex surface C2 of the connection head portion 14 in the lead pin 10 in FIG. 4, while the straight inclining surface C4 is provided in the outside of the convex surface C2 of the connection head portion 14 in the lead pin 10a in FIG. 6. However, other shaped surface in addition to the concave surface C3 and the straight inclining surface C4 may be employed. That is, an inclined surface whose height goes down toward the outer side may be provided in the outside region of the convex surface C2 of the connection head portion 14.

Next, a method of manufacturing a wiring substrate with lead pin according to the embodiment will be explained hereunder. As depicted in FIG. 7, first, a wiring substrate 20 to which the lead pins are to be fitted is prepared. In the wiring substrate 20, through holes TH are provided in a core substrate 22 and a penetrating electrode 24 is formed in the through holes TH respectively. Also, first wiring layers 30 which are connected mutually via the penetrating electrodes 24 are formed on both surface sides of the core substrate 22 respectively.

Also, a first interlayer insulating layer 40 is formed on both surface sides of the core substrate 22 respectively. Also, first via holes VH1 which reach the first wiring layer 30 are formed in the first interlayer insulating layer 40 on both surface sides.

Also, second wiring layers 32 which are connected to the first wiring layers 30 via the first via hole VH1 (via conductor) are formed on the first interlayer insulating layer 40 on both surface sides.

Similarly, a second interlayer insulating layer 42 in which second via holes VH2 reaching the second wiring layer 32 are provided is formed on the second wiring layer 32 on both surface sides of the core substrate 22 respectively. Also, similarly, third wiring layers 34 which are connected to the second wiring layers 32 via the second via hole VH2 (via conductor) are formed on the second interlayer insulating layer 42 on both surface sides respectively.

Further, a solder resist 44 in which an opening portion 44a is provided on connection portions of the third wiring layers 34 is formed on both surface sides of the core substrate 22 respectively.

The connection portions of the third wiring layers 34 on the upper surface side of the core substrate 22 act as chip connection portions S1 for connecting a semiconductor chip. Also, the connection portions of the third wiring layers 34 on the lower surface side of the core substrate 22 act as pin connection portions S2 for fitting the lead pin. A contact layer (not shown) such as a Ni/Au plating layer, or the like is formed on surfaces of the chip connection portions S1 and the pin connection portions S2 respectively.

In this manner, the wiring substrate 20 employed in the embodiment includes the pin connection portions S2 on one surface, and includes the chip connection portions S1 on the other surface.

Then, as depicted in FIG. 8, the wiring substrate 20 in FIG. 7 is reversed up and down, and the pin connection portions S2 are directed upward. Then, the solder is coated on the pin connection portions S2 of the wiring substrate 20, and then the connection head portion 14 of the lead pin 10 of the embodiment is arranged on the solder portions respectively. Then, the reflow soldering is applied by the heating process, so that the connection head portion 14 of the lead pin 10 is connected to the pin connection portions S2 of the wiring substrate 20 via a solder layer 36 respectively.

At this time, like the related art, when a large number of lead pins 10 are soldered, often the lead pin 200 which is arranged in an inclined state occurs. In FIG. 8, an example in which the lead pin 10 arranged in the center is inclined toward the left side as one faces is illustrated.

Then, as depicted in FIG. 9, the wiring substrate 20 to which the lead pins 10 in FIG. 8 are fitted is reversed up and down, and the chip connection portions S1 are directed upward. Then, a semiconductor chip 50 (LSI chip) is prepared, and then the connection electrodes of the semiconductor chip 50 are arranged on the chip connection portions S1 of the wiring substrate 20 via the solder ball, or the like. Then, the reflow soldering is applied by the heating process, so that the connection electrodes of the semiconductor chip 50 are flip-chip connected to the chip connection portions S1 of the wiring substrate 20 via a solder layer 38.

At this time, simultaneously the solder layers 36 fixing the lead pins 10 to the wiring substrate 20 are reflown again. The lead pin 10 of the embodiment includes the convex surface C2 which is rounded by a radius R like a convex shape, and the concave surface C3 which is rounded by a radius R like a concave shape to the edge side of the bonding surface C of the connection head portion 14.

By employing such lead pin 10, an adequate amount of solder that can correct the inclination of the lead pin 10 during the reflow soldering is arranged in the periphery of the side surface of the connection head portion 14.

Figure 10:
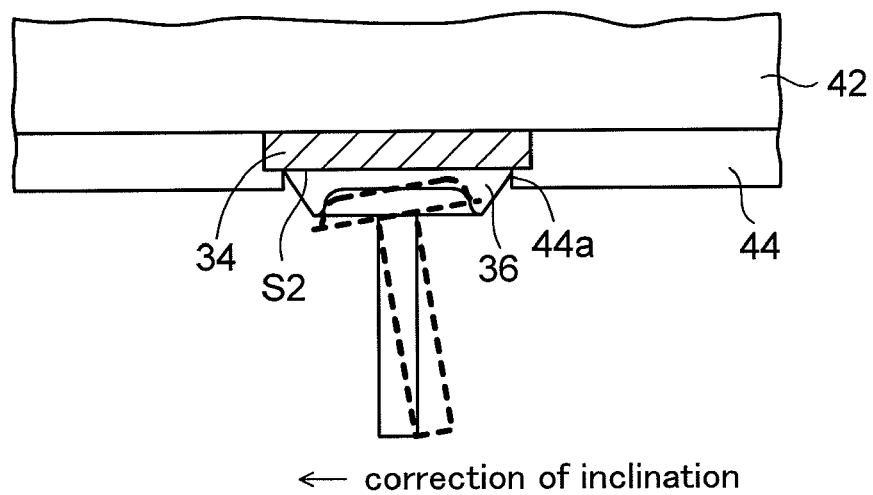
FIG. 10 is a sectional view depicting a state that an inclination of the lead pin is corrected, in the method of manufacturing the wiring substrate with lead pin according to the embodiment.

Accordingly, as the explanation by adding FIG. 10, the lead pin 10 arranged in an inclined state (indicated with a broken line in FIG. 10) is moved toward the perpendicular direction by the action of the reflow of solder and the gravitation, and thus an inclination of the lead pin 10 is corrected (indicated with a solid line in FIG. 10).

Unlike the embodiment, in the case that an amount of solder which is arranged in the periphery of the side surface of the connection head portion of the lead pin is too much (for example, the round type connection head portion whose radius R is maximum (whose thickness is very thin) is employed), a movement of the lead pin is too large and thus often the lead pin is inclined in the opposite direction.

Conversely, in the case that an amount of solder which is arranged in the periphery of the side surface of the connection head portion of the lead pin is too little (for example, the flat type connection head portion), a movement of the lead pin is too small and thus an inclination of the lead pin cannot be sufficiently corrected.

In the method of manufacturing the wiring substrate with lead pin of the embodiment, when the semiconductor chip 50 is reflow soldered to the wiring substrate 20, it is necessary to make the solder layer 36 fixing the lead pin 10 reflow again. Therefore, a melting point (reflow temperature) of the solder layer 36 for connecting the lead pin 10 is set equal to or less than a melting point of the solder layer 38 for connecting the semiconductor chip 50.

With the above, a wiring substrate with lead pin 1 (a semiconductor device with lead pin) of the embodiment is obtained. As depicted in FIG. 9, in the wiring substrate with lead pin 1 of the embodiment, the connection head portion 14 of the lead pin 10 is connected and fixed to the pin connection portion S2 of the wiring substrate 20 explained in FIG. 7 by the solder layer 36. The solder layer 36 contacts the whole of the bonding surface C of the connection head portion 14 of the lead pin 10.

Also, the connection electrodes of the semiconductor chip 50 are flip-chip connected to the chip connection portions S1 of the wiring substrate 20 via the solder layer 38 (solder bump).

As described above, in the method of manufacturing the wiring substrate with lead pin of the embodiment, when the semiconductor chip 50 is reflow soldered to the wiring substrate 20, the solder layer 36 fixing the lead pin 10 is reflown again.

Accordingly, an inclination of the lead pin 10 which is arranged in an inclined state is corrected adequately toward the perpendicular direction side in a state of hanging in midair under the wiring substrate 20. Therefore, an amount of inclination of the lead pin 10 can be suppressed within a design specification and, as a result, the wiring substrate with lead pin can be manufactured with good yield.

Also, in the flat type lead pin 200 (FIG. 1 and FIG. 2) and the round type lead pin 400 (FIG. 3) in the foregoing related art, when the lead pin is bonded to the pin connection portion 120 of the wiring substrate 100 by the solder layer 260, a solder crawls up to the back surface (the opposite surface to the bonding surface) of the connection head portion 240, 440 of the lead pin 200, 400.

At this time, an extent of the crawling-up of the solder is varied in the wiring substrate. Therefore, when the wiring substrate to which the lead pins are bonded is viewed from the pin shaft side, an appearance of the wiring substrate lacks unity and the appearance becomes worse.

In contrast, the lead pin 10, 10*a* of the embodiment includes the inclining surface C3, C4, and therefore such a situation is prevented that the solder crawls up to the back surface (the opposite surface to the bonding surface) of the lead pin 10, 10*a*.

That is, as depicted in FIG. 9 as above, the solder layer 36 which bonds the lead pin 10 to the wiring substrate 20 exists only on the bonding surface C side of the connection head portion 14 of the lead pin 10. As a result, when the wiring substrate to which the lead pins are bonded is viewed from the pin shaft side, an appearance of the wiring substrate has unity and the appearance is improved.

The inventor of this application studied how a contact area (surface area) of the bonding surface C to the solder is changed when a radius R for constructing the convex surface C2 and the concave surface C3 is changed in the lead pin 10 in FIG. 4 in the above embodiment. Also, a contact area (surface area) of the bonding surface of the round type lead pin with the solder were calculated as the comparative object.

A contact area (surface area) of the bonding surface C of the lead pin 10 with the solder affects pin-pull strength when the lead pin 10 is bonded by the solder. Therefore, it is preferable that, as a criterion, such contact area should be set equal to a contact area of the bonding surface of the round type lead pin from which an enough pin-pull strength can be obtained.

Figure 11:
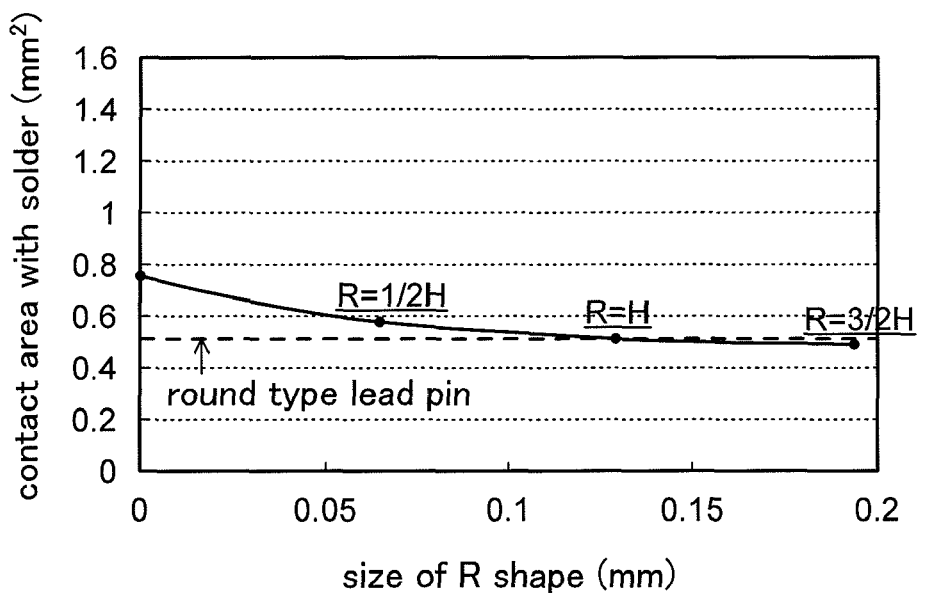
FIG. 11 depicts a contact area with solder in a connection head portion of the lead pin according to the embodiment.
Figure 11:
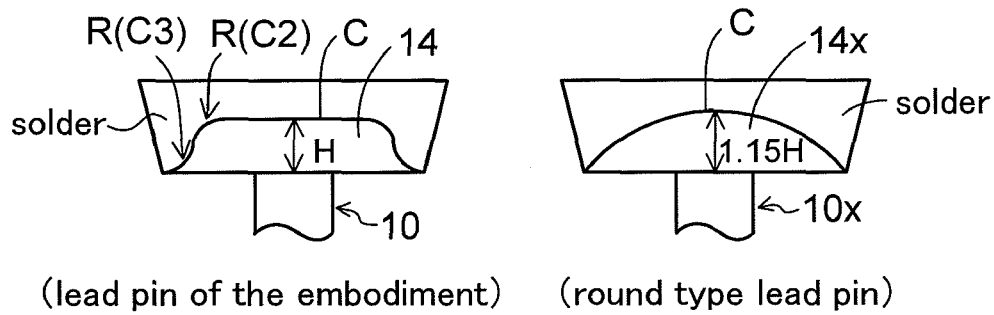

As indicated with a broken line in a graph in FIG. 11, when the connection head portion 14 (thickness: H=0.13 mm) of the lead pin 10 of the embodiment is replaced with a connection head portion 14*x* (thickness: 1.15H–1.15×0.13 mm) of a round type lead pin 10*x*, a contact area becomes about 0.5 mm$^2$. In the case that the connection head portion of the lead pin has a contact area in such extent, such lead pin has a sufficient pin-pull strength.

Also, as depicted in the graph in FIG. 11, in the case that respective radius R for constructing the convex surface C2 and the concave surface C3 of the lead pin 10 of the embodiment are set equal to a thickness H (about 0.13 mm) of the connection head portion 14 (R=H in FIG. 11), a contact area of the bonding surface C becomes substantially equal to that of the round type lead pin 10*x* (contact area: about 0.5 mm$^2$).

In contrast, when respective radius R for constructing the convex surface C2 and the concave surface C3 of the lead pin 10 of the embodiment are made gradually smaller than a thickness H of the connection head portion 14 (particularly, an area of R=½H or less in FIG. 11), a contact area of the bonding surface C is increased gradually larger. Conversely, when respective radius R are made gradually larger than a thickness H of the connection head portion 14 (particularly, an area of R=3/2H or more in FIG. 11), a contact area of the bonding surface C is decreased gradually smaller.

In this event, when a contact area (surface area) of the bonding surface C of the lead pin 10 is increased gradually larger (in the direction along which the radius R is decreased gradually), a pin-pull strength is increased, nevertheless an amount of solder provided in the periphery of the side surface of the connection head portion 14 is reduced. Thus, in some cases an inclination cannot be sufficiently corrected.

Conversely, when a contact area (surface area) of the bonding surface C of the lead pin 10 is decreased gradually smaller (in the direction along which the radius R is increased gradually), an amount of solder provided in the periphery of the side surface of the connection head portion 14 is excessively large. Thus, it is feared that a position of the lead pin is moved excessively.

From such viewpoints, it is preferable that respective radius R for constructing the convex surface C2 and the concave surface C3 of the lead pin 10 should be set in a range of ½H (0.5H) to H (H: thickness of the connection head portion 14) respectively.

Next, the inventor of this application analyzed an amount of return of the lead pin by the simulation in order to check an effect of the lead pin of the embodiment.

Figure 12A:
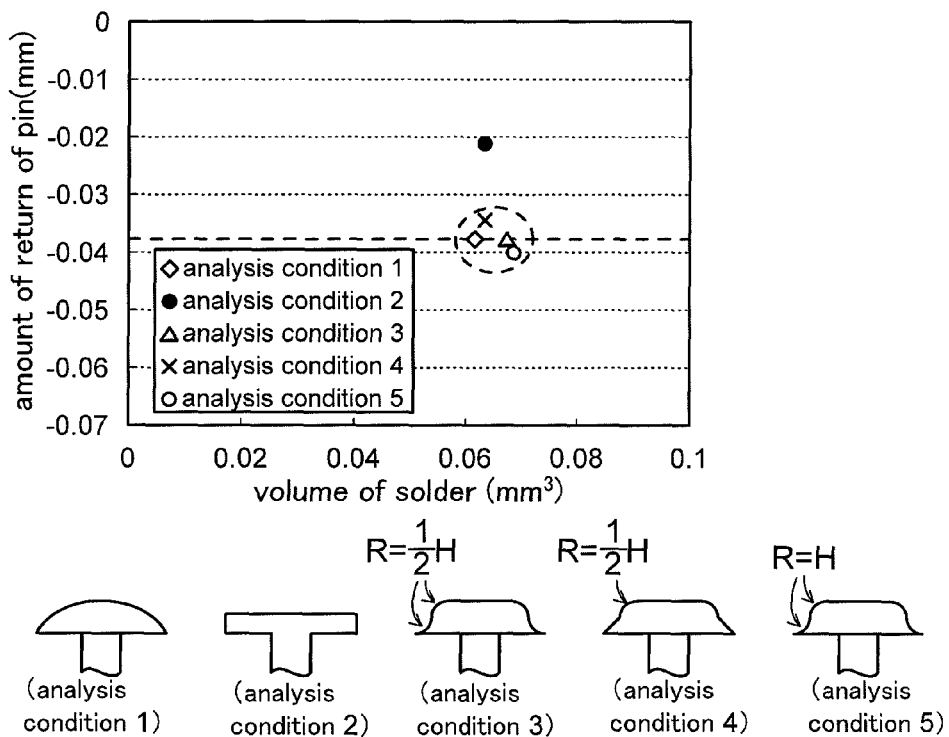
FIGS. 12A and 12B depict a simulation result of an amount of return upon correcting an inclination of the lead pin according to the embodiment.

As depicted in FIG. 12A, as the precondition of simulation, Alloy 194 (copper alloy) was employed as the material of the lead pin. A density of Alloy 194 is 8.92E-09 Ton/mm$^3$, a Young's modulus is 121000 MPa, and a Poisson's ratio is 0.35.

Also, 82% Pb (lead)/10% Sn (tin)/8% Sb (antimony) was employed as the material of solder for fixing the lead pin, a density of this solder was set to 8.4E-09 Ton/mm$^3$, a Young's modulus was set to 5E-5 MPa, and a Poisson's ratio was set to 0.36.

Figure 12B:
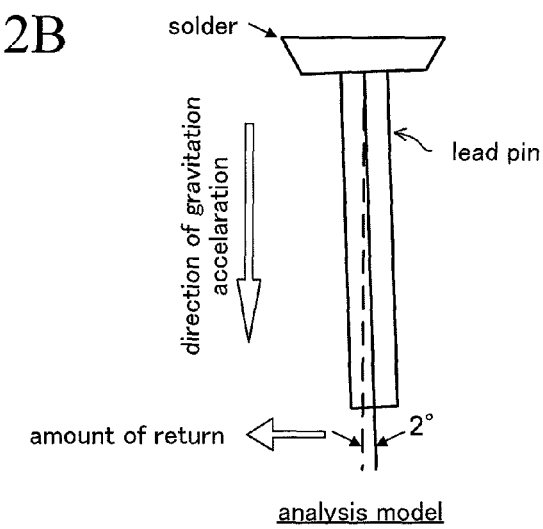

In the present simulation, in order to exaggerate a movement due to the influence of the gravitation in respective analysis conditions, a Young's modulus of the solder was changed to a soft value. Also, as depicted in the analysis model in FIG. 12B, it was analyzed to what extent an inclination of the lead pin which is tilted by 2° to the right side from the perpendicular direction returns to the perpendicular direction side. A deformation state of the lead pin due to its own weight was analyzed while taking account of the gravitation acceleration.

As depicted in FIG. 12A, the sample of the analysis condition 1 is the round type lead pin (the above related art), and the sample of the analysis condition 2 is the flat type lead pin (the above related art). The sample of the analysis condition 3 is the lead pin in which respective radius R for constructing the convex surface C2 and the concave surface C3 are set to ½H (H: thickness of the connection head portion 14) in the lead pin 10 in FIG. 4 of the embodiment.

The sample of the analysis condition 4 is the lead pin 10*a* (the concave surface C3 is changed into the straight inclining surface C4) of the variation in above FIG. 6. Also, the sample of the analysis condition 5 is the lead pin in which respective radius R for constructing the convex surface C2 and the concave surface C3 are set to H (H: thickness of the connection head portion 14) in the lead pin 10 in FIG. 4 of the embodiment.

As depicted in the graph in FIG. 12A, according to the simulation result, an amount of return of the round type lead pin in the analysis condition 1 was about −0.038 mm. A minus (−) sign of an amount of return means that the lead pin was moved to the direction indicated with an arrow in the analysis model in FIG. 12B. The round type lead pin has such a structure that an inclination can be easily corrected, and an inclination defect of the lead pin can be prevented by causing the movement in this extent.

An amount of return of the flat type lead pin in the analysis condition 2 was about −0.022 mm, and an inclination defect of the lead pin easily occurred because an amount of return was small. As described above, this is caused due to the fact that an amount of the solder which is arranged in the periphery of the side surface of the connection head portion is small in the flat type lead pin.

In contrast, in the lead pin (respective radius R of the convex surface and the concave surface are equal to ½H) of the embodiment in the analysis condition 3, an amount of return was equivalent (about −0.038 mm) to that in the analysis condition 1 (the round type lead pin), and it is understood that and such a structure that an inclination can be easily corrected was provided.

In the lead pin according to the variation of the embodiment in the analysis condition 4 (the radius R of the convex surface is ½H, and the edge part constitutes the straight inclining surface), an amount of return was about −0.035 mm and this amount of return was smaller than those in the analysis conditions 1 and 3, but an inclination can be corrected sufficiently to such extent that the failure can be prevented.

Also, in the other lead pins of the embodiment in the analysis condition 5 (the radius R of the convex surface and the concave surface are equal to H), an amount of return was about −0.04 mm and this amount of return was larger than those in the analysis conditions 1 and 3, but an inclination can be corrected sufficiently to such extent that the failure can be prevented.

According to the above simulation result, it can be understood that an inclination can be corrected sufficiently when respective radius R for constructing the convex surface C2 and the concave surface C3 of the connection head portion 14 of the lead pin 10 are set in the range of ½H (0.5H) to H (H: thickness of the connection head portion 14). Also, it is similar in the case that the concave surface C3 of the connection head portion 14 is replaced with the straight inclining surface C4.

The analyzed result of the present simulation shows a preferable example in a limited range for extracting the performances that are equivalent to those of the round type lead pin. An area of the flat surface C1 of the connection head portion 14, and respective radius R for constructing the convex surface C2 and the concave surface C3 (or an inclined angle of the straight inclining surface C4) can be set to an arbitrary value respectively.

In other words, an area of the flat surface C1, respective radius R for constructing the convex surface C2 and the concave surface C3, and an inclined angle of the straight inclining surface C4 may be optimized such that an inclination can be corrected in response to a design specification of an inclination of the lead pin, the specifications of the wiring substrate (an area of the pin connection portion, etc.), the material of solder, the conditions of the reflow soldering, etc.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A lead pin, comprising: a shaft portion; and
a connection head portion provided to a top end side of the shaft portion, and having a diameter which is larger than a diameter of the shaft portion; wherein the connection head portion includes a bonding surface on an opposite side to the shaft portion side, and the bonding surface includes a flat surface provided in a center part, and extends to a convex surface which is provided in substantially a first ring shape at an outer periphery of the flat surface such that the flat surface is continuous with and smoothly joins the convex surface, wherein a peripheral edge of the flat surface and an inside edge of the convex surface meet at an identical height position and the flat surface does not protrude from the convex surface, the convex surface having a rounded portion with a radius R in substantially a convex shape, the convex surface extending from the peripheral edge of the flat surface to an inclining surface which is provided in substantially a second ring shape at an outside of the convex surface and a height of the inclining surface is lowered toward an outside gradually, the inclining surface widening toward the outside gradually, and wherein a diameter of the flat surface is larger than a diameter of a shaft portion.

2. The lead pin according to claim 1, wherein the inclining surface is a concave surface having a rounded portion with a radius R2 in substantially a concave shape.

3. The lead pin according to claim 1, wherein the inclining surface is straight along a radial cross section.

4. The lead pin according to claim 1, wherein the radius R is set in a range of 0.5 H to H, when H is a thickness of the connection head portion.

5. A wiring substrate with lead pin, comprising:
the lead pin set forth in claim 1; and
a wiring substrate including a pin connection portion; wherein the connection head portion of the lead pin is connected to the pin connection portion of the wiring substrate via a solder layer.

6. The wiring substrate with lead pin, according to claim 5, wherein the wiring substrate includes a chip connection portion on an opposite surface to a surface on which the pin connection portion is provided, and a semiconductor chip is connected to the chip connection portion of the wiring substrate by a reflow soldering.

7. The wiring substrate with lead pin, according to claim 5, wherein the solder layer exists only on a bonding surface side of the connection head portion of the lead pin.

8. A method of manufacturing a wiring substrate with lead pin, comprising:
preparing the lead pin set forth in claim 1, and
a wiring substrate including a pin connection portion on one surface and a chip connection portion on the other surface;
connecting the connection head portion of the lead pin to the pin connection portion via a solder layer in a state such that the pin connection portion of the wiring substrate is directed upward; and
connecting a semiconductor chip to the chip connection portion by a reflow soldering in a state that the chip connection portion of the wiring substrate is directed upward, and simultaneously making the solder layer connecting the lead pin reflow in a state that the lead pin hangs in midair under the wiring substrate.

9. The method of manufacturing a wiring substrate with lead pin, according to claim 8, wherein, in the step of making the solder layer connecting the lead pin reflow, an inclination of the lead pin which is fitted with an inclined state from a perpendicular direction is corrected toward the perpendicular direction side based on a reflow of the solder layer and gravitation.

10. The lead pin according to claim 1, wherein the inclining surface is a concave surface or straight along a radial cross section.

11. The lead pin according to claim 1, wherein the height is a height along an axial direction of the shaft portion.

12. The lead pin according to claim 1, wherein the radius R is a radius of substantially a cross section of a toroidal shape.

* * * * *